(12) United States Patent
Shih et al.

(10) Patent No.: US 6,677,255 B1
(45) Date of Patent: Jan. 13, 2004

(54) METHOD FOR REMOVING FENCES WITHOUT REDUCTION OF ONO FILM THICKNESS

(75) Inventors: Hsueh-Hao Shih, Hsinchu (TW); Kuang-Chao Chen, Hsinchu (TW)

(73) Assignee: Macroniox International Co., Ltd., Hsinchu (TW)

( * ) Notice: Subject to any disclaimer, the term of this patent is extended or adjusted under 35 U.S.C. 154(b) by 0 days.

(21) Appl. No.: 10/230,328

(22) Filed: Aug. 29, 2002

(51) Int. Cl.$^7$ .................. H01L 21/31; H01L 21/26; H01L 21/42
(52) U.S. Cl. .................. 438/786; 438/954; 438/287; 438/257
(58) Field of Search ........................ 438/786, 216, 438/257, 287, 778, 954

(56) References Cited

U.S. PATENT DOCUMENTS

| 6,043,005 | A | 3/2000 | Haq |
|---|---|---|---|
| 6,127,277 | A | 10/2000 | DeOrnellas et al. |
| 6,242,350 | B1 | 6/2001 | Tao et al. |
| 6,277,762 | B1 | 8/2001 | Hwang |
| 6,436,766 | B1 * | 8/2002 | Rangarajan et al. ......... 438/261 |
| 6,486,029 | B1 * | 11/2002 | Foote et al. ................ 438/261 |

* cited by examiner

Primary Examiner—Richard Elms
Assistant Examiner—Beth E. Owens
(74) Attorney, Agent, or Firm—Finnegan, Henderson, Farabow, Garrett & Dunner, L.L.P.

(57) ABSTRACT

A method of manufacturing a semiconductor device including providing a first layer, forming a layer of stacked oxide-nitride-oxide layer over the first layer, depositing a first silicon layer over the layer of stacked oxide-nitride-oxide layer, providing a layer of photoresist over the first silicon layer, patterning and defining the photoresist layer, etching the first silicon layer and stacked oxide-nitride-oxide layer unmasked by the photoresist, removing the photoresist layer, providing a cleaning solution to the stacked oxide-nitride-oxide layer with the first silicon layer as a mask, and depositing a second layer of polysilicon over the first silicon layer to form a combined silicon layer.

19 Claims, 1 Drawing Sheet

METHOD FOR REMOVING FENCES WITHOUT REDUCTION OF ONO FILM THICKNESS

FIELD OF THE INVENTION

The invention relates in general to a method of fabricating a semiconductor device, and, more specifically, to a method of removing fences after etching without reducing the thickness of a dielectric layer.

BACKGROUND

In general, a flash memory device includes a floating gate formed over a first dielectric layer, which is formed over a semiconductor substrate, a control gate, and a second dielectric layer formed between the floating and control gates. The second dielectric layer is often comprised of a bottom silicon oxide layer, middle silicon nitride layer, and top silicon oxide layer. Such a structure is known as an oxide-nitride-oxide ("ONO") structure. The resulting staked dielectric layer provides superior electrical isolation between the floating and control gates. However, an ONO structure may also be used for the first dielectric layer, and generally in conventional transistors or other types of memories.

During the manufacturing process relating to the ONO structure, a photoresist ("PR") is usually provided over the top silicon oxide layer. After the PR is defined and patterned, an etch step, usually dry etch, follows to remove certain portions of the ONO structure. The etching process often results in the formation of ONO fences, or residues, that may adversely affect the subsequent manufacturing steps. Because the ONO fences remain behind after the PR is stripped, a subsequent cleaning process is used to remove the fences.

Conventionally, a HF or a SC-1 solution, which is typically a 5:1:1 solution of water, hydrogen peroxide, and ammonium hydroxide, is used. However, the top oxide layer, which is typically relatively thin, becomes even thinner due to the chemical cleaning process. The process may decrease the effective oxide thickness ("EOT") of the ONO structure. If the EOT is overly decreased, the thickness between the floating gate and control gate may be decreased to such an extent so as to adversely affect the performance of the completed semiconductor device. For example, leakage currents may occur because of the reduction in the EOT of the ONO layer.

SUMMARY OF THE INVENTION

In accordance with the invention, there is provided a method of manufacturing a semiconductor device that includes providing a wafer substrate, providing an insulator over the wafer substrate, depositing a first polysilicon layer over the insulator, forming a layer of stacked oxide-nitride-oxide layer over the first polysilicon layer, depositing a second silicon layer over the layer of stacked oxide-nitride-oxide layer, providing a layer of photoresist over the second silicon layer, patterning and defining the photoresist layer, etching the second silicon layer and stacked oxide-nitride-oxide layer unmasked by the photoresist, removing the photoresist layer, providing a cleaning solution to the stacked oxide-nitride-oxide layer with the second silicon layer as a mask, and depositing a third layer of polysilicon over the second silicon layer.

Also in accordance with the present invention, there is provided a method of manufacturing a semiconductor device that includes providing a first layer, forming a layer of stacked oxide-nitride-oxide layer over the first layer, depositing a first silicon layer over the layer of stacked oxide-nitride-oxide layer, providing a layer of photoresist over the first silicon layer, patterning and defining the photoresist layer, etching the first silicon layer and stacked oxide-nitride-oxide layer unmasked by the photoresist, removing the photoresist layer, providing a cleaning solution to the stacked oxide-nitride-oxide layer with the first silicon layer as a mask, and depositing a second layer of polysilicon over the first silicon layer to form a combined silicon layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
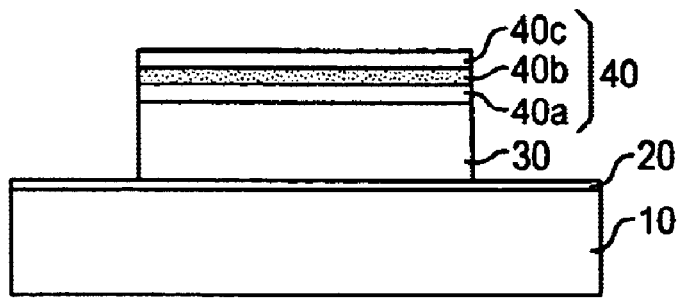
FIGS. 1–3 are cross-sectional views of the fabrication steps consistent with one embodiment of the present invention.

The present invention provides a method of removing fences formed after ONO film etching without reducing the thickness of the ONO film. Referring to FIG. 1, an embodiment of the method of the present invention commences with defining a wafer substrate 10. An insulator 20 is formed over substrate 10. Insulator 20 may be comprised of silicon oxide. A first layer of polysilicon 30 is formed above insulator 20. First layer of polysilicon 30 is the floating gate.

A layer of stacked dielectric film 40 is then provided over floating gate 30. Dielectric film 40 includes a first oxide layer 40a, nitride layer 40b, and second oxide layer 40c. In one embodiment, first oxide layer 40a is deposited over floating gate 30 by a conventional chemical vapor deposition ("CVD") process, or thermally grown over floating gate 30. Nitride layer 40b is deposited over first oxide layer 40a, and second oxide layer 40c is deposited over nitride layer 40b by a conventional CVD process. In one embodiment, first oxide layer 40a has a thickness of about 40 to 150 Angstroms. Nitride layer 40b has a thickness of about 40 to 90 Angstroms. Second oxide layer 40c has a thickness of about 40 to 90 Angstroms.

Figure 2:
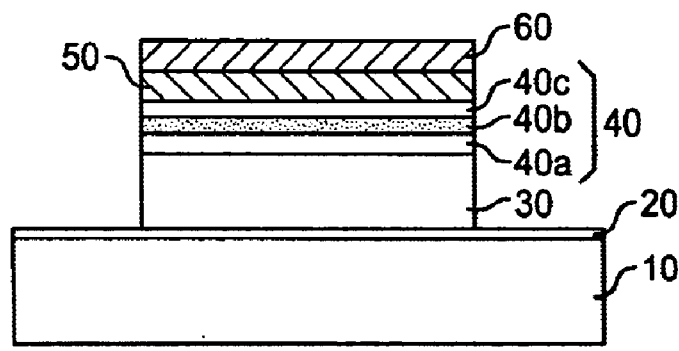

Referring to FIG. 2, after ONO dielectric film 40 is formed, a second silicon film 50 is deposited over second oxide layer 40c of ONO dielectric film 40. In one embodiment, second silicon film 50 may be amorphous or polycrystalline silicon, and has a thickness of about 100 to 500 Angstroms. Second silicon film 50 will serve as a hardmask over ONO dielectric film 40. In addition, in the subsequent manufacturing process, second silicon film 50 need not be removed, thereby obviating the need for additional manufacturing steps. A photoresist ("PR") layer 60 is then provided over second silicon film 50.

Figure 3:
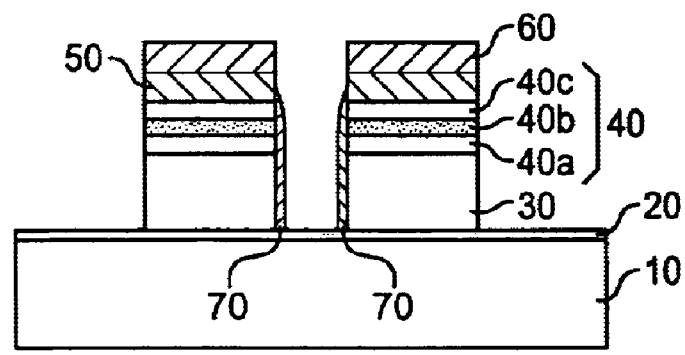

Referring to FIG. 3, PR 60 is patterned and defined using a conventional photolithographic process. A step of dry etching is then performed. The etching step also causes the formation of fences 70. PR 60 is then stripped and removed. A cleaning step follows to remove fences 70. In one embodiment, a HF or a SC-1 solution is used to remove the fences 70. The SC-1 solution typically is a 5:1:1 solution of water, hydrogen peroxide, and ammonium hydroxide. Because second silicon film 50 acts as a mask, second oxide layer 40c is protected from the cleaning solutions during the cleaning process. Accordingly, the disadvantages associated with the conventional methods are avoided.

An optional step of removing native oxide that may have formed over the top surface of second silicon film 50 may be performed to remove any such native oxide. A third polysilicon layer (not shown) is then deposited over second silicon film 50. In one embodiment, the thickness of the third polysilicon layer is about 1,000 Angstroms. Second silicon film 50 becomes part of a combined silicon layer, which is then masked and etched with conventional manufacturing steps to form a control gate.

The method of the present invention is also applicable to the formation of a single-gate transistor or memory that uses an ONO layer to electrically insulate a polysilicon gate from the substrate.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device, comprising:

providing a wafer substrate;

providing an insulator over the wafer substrate;

depositing a first polysilicon layer over the insulator;

forming a layer of stacked oxide-nitride-oxide layer over the first polysilicon layer;

depositing a second silicon layer over the layer of stacked oxide-nitride-oxide layer;

providing a layer of photoresist over the second silicon layer;

patterning and defining the photoresist layer;

etching the second silicon layer and stacked oxide-nitride-oxide layer unmasked by the photoresist;

removing the photoresist layer;

providing a cleaning solution to the stacked oxide-nitride-oxide layer with the second silicon layer as a mask; and depositing a third layer of polysilicon over the second silicon layer.

2. The method as claimed in claim 1, wherein the stacked oxide-nitride-oxide layer is comprised of a bottom oxide layer, a middle nitride layer, and a top oxide layer.

3. The method as claimed in claim 2, wherein the bottom oxide layer has a thickness of about 40 to 150 Angstroms.

4. The method as claimed in claim 2, wherein the middle nitride layer has a thickness of about 40 to 90 Angstroms.

5. The method as claimed in claim 2, wherein the top oxide layer has a thickness of about 40 to 90 Angstroms.

6. The method as claimed in claim 1, wherein the second silicon layer is amorphous or polycrystalline silicon.

7. The method as claimed in claim 6, wherein the second silicon layer has a thickness of about 100 to 500 Angstroms.

8. The method as claimed in claim 1, wherein the third polysilicon layer has a thickness of about 1000 Angstroms.

9. The method as claimed in claim 1, wherein the step of providing a cleaning solution comprises providing a HF solution.

10. The method as claimed in claim 1, wherein the step of providing a cleaning solution comprises providing a mixture of water, hydrogen peroxide, and ammonium hydroxide.

11. The method as claimed in claim 1, further comprising removing native oxide formed on the second silicon film.

12. A method of manufacturing a semiconductor device, comprising:

providing a first layer;

forming a layer of stacked oxide-nitride-oxide layer over the first layer;

depositing a first silicon layer over the layer of stacked oxide-nitride-oxide layer;

providing a layer of photoresist over the first silicon layer;

patterning and defining the photoresist layer;

etching the first silicon layer and stacked oxide-nitride-oxide layer unmasked by the photoresist;

removing the photoresist layer;

providing a cleaning solution to the stacked oxide-nitride-oxide layer with the first silicon layer as a mask; and depositing a second layer of polysilicon over the first silicon layer to form a combined silicon layer.

13. The method as claimed in claim 12, wherein the stacked oxide-nitride-oxide layer is comprised of a bottom oxide layer, a middle nitride layer, and a top oxide layer.

14. The method as claimed in claim 12, wherein the first layer is a layer of polysilicon.

15. The method as claimed in claim 12, wherein the first layer is an insulator formed over a silicon substrate.

16. The method as claimed in claim 12, wherein the first silicon layer is amorphous or polycrystalline silicon.

17. The method as claimed in claim 12, wherein the step of providing a cleaning solution comprises providing a HF solution.

18. The method as claimed in claim 12, wherein the step of providing a cleaning solution comprises providing a mixture of water, hydrogen peroxide, and ammonium hydroxide.

19. The method as claimed in claim 12 further comprising removing native oxide formed on the first silicon film.

* * * * *